(12) United States Patent
Liu et al.

(10) Patent No.: US 6,309,919 B1
(45) Date of Patent: Oct. 30, 2001

(54) METHOD FOR FABRICATING A TRENCH-GATED VERTICAL CMOS DEVICE

(75) Inventors: Yowjuang W. Liu, San Jose; Donald L. Wollesen, Saratoga, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/237,001

(22) Filed: Jan. 25, 1999

Related U.S. Application Data

(62) Division of application No. 08/832,657, filed on Apr. 4, 1997, now Pat. No. 5,864,158.

(51) Int. Cl.$^7$ .............................................. H01L 21/8238
(52) U.S. Cl. ................... 438/199; 438/188; 438/192; 438/202; 438/211; 438/270; 438/268
(58) Field of Search ...................... 438/188, 192, 438/199, 202, 206, 209, 211, 212, 135, 138, 268, 270; 257/330, 335, 331, 340

(56) References Cited

U.S. PATENT DOCUMENTS

| | | | |
|---|---|---|---|
| 3,758,943 | * 9/1973 | Shibata | 29/578 |
| 4,670,768 | * 6/1987 | Sunami et al. | 357/42 |
| 4,729,966 | * 3/1988 | Koshino et al. | 437/39 |
| 5,100,823 | * 3/1992 | Yamada | 437/52 |
| 5,106,776 | * 4/1992 | Shen et al. | 437/52 |
| 5,380,670 | * 1/1995 | Hagino | 437/31 |
| 6,133,587 | * 10/2000 | Takeuchi et al. | 257/77 |
| 6,162,714 | * 12/2000 | Castagnetti et al. | 438/587 |
| 6,188,104 | * 2/2001 | Choi et al. | 257/330 |
| 6,188,105 | * 2/2001 | Kocon et al. | 257/330 |
| 6,190,954 | * 2/2001 | Lee et al. | 438/199 |

\* cited by examiner

Primary Examiner—Matthew Smith
Assistant Examiner—Renzo N. Rocchegiani
(74) Attorney, Agent, or Firm—Foley & Lardner

(57) ABSTRACT

Complementary metal-oxide-semiconductor (CMOS) transistors (18,22) are formed with vertical channel regions (30,52) on an insulator substrate (14). Highly doped polysilicon gates (44,68) are formed in trenches (36,58) to extend laterally around the channel regions (30,52) as insulatively displaced therefrom by gate insulators (41,62) that are grown on the sidewalls of the trenches (36,58). The transistors (18,22), which are formed in respective mesas (20,24) have deeply implanted source regions (28,50) that are ohmically connected to the semiconductor surface via respective source connector regions (34,70).

20 Claims, 3 Drawing Sheets

METHOD FOR FABRICATING A TRENCH-GATED VERTICAL CMOS DEVICE

CROSS-REFERENCE TO RELATED APPLICATION

The present application is a division of and claims priority to U.S. patent application Ser. No. 08/832,657, filed on Apr. 4, 1997 now U.S. Pat. No. 5,864,158.

TECHNICAL FIELD OF THE INVENTION

The present invention relates in general to integrated circuits, and more particularly to a vertical complementary metal-oxide-semiconductor (CMOS) device and method for fabricating same.

BACKGROUND OF THE INVENTION

In traditional semiconductor fabrication techniques, integrated circuit devices such as transistors are laid out in a relatively planar, thin film at the surface of a semiconductor substrate. As time has passed, there has been a need to make these devices smaller and smaller, such that they occupy less "real estate" on the surface of the semiconductor chip which they occupy. As the dimensions of the device shrink, barriers to further downsizing begin to appear. For example, the depth of focus on small devices drops dramatically. One encounters line width control problems, alignment problems and problems with contacts. Squares become rounded in their shape; some features may disappear entirely with a loss of focus. Conventionally, the minimum size of a channel length of a transistor is determined by the minimum lithography obtainable by the stepper used to fabricate chips on the wafer. As the minimum channel length decreases, the cost of the stepper increases. A need therefore continues to exist for devices which occupy a small amount of real estate, whose critical dimensions are not controlled by lithographic constraints, and which at the same time have acceptable reliability, cost and operational performance.

SUMMARY OF THE INVENTION

The present invention relates to a device having a transistor channel formed to be approximately perpendicular to the surface of a substrate on which the device is formed. The length of this channel is therefore more independent of lithographic constraints. According to one aspect of the invention, a semiconductor layer is formed on the substrate to be of a first conductivity type. A heavily doped region is formed in the semiconductor layer to be spaced from the surface of the semiconductor layer and to be of a second conductivity type. A drain region is formed adjacent to the semiconductor layer surface and is spaced from an upper boundary of the heavily doped region by a channel region. A sidewall of the channel region extends from the top surface of the channel region at least to the boundary of the heavily doped region, and a gate insulator is formed on this sidewall. A conductive gate is formed adjacent the sidewall. A source voltage is connected to the heavily doped region. In this manner, a vertical channel region is formed between a drain region on the top of the device and a source region that is formed in the semiconductor layer. Preferably, the source voltage is supplied to the semiconductor layer through a source connector region that is formed to extend from the surface of the semiconductor layer to the boundary of the source region.

In one embodiment of the invention, the conductive gate, which for example can be highly doped polysilicon, is formed as a ring or other endless structure to surround that portion of the semiconductor layer that includes the channel region. The source connector region is formed laterally exterior to a trench containing the gate.

This device is preferably built as a mesa of semiconductor material on a substrate insulator (SOI); in a CMOS embodiment, a second device having reversed conductivity types for its components is built in another mesa. The mesas are separated from each other and from other devices by an insulator such as oxide.

Several technical advantages inhere in the device of the invention. There is no hot carrier injection concern, as the channel region conducts current in bulk in its body rather along its surface. The voltage distribution is more uniform. A higher performance is obtained because the horizontal area of the drain region is the same as the cross-sectional area of the channel region, making the effective transistor size larger. The channel length is not controlled by lithography, and thus a channel length of less than L can be obtained, where L is the minimum lithographic feature dimension. This channel region can instead be controlled by diffusion, implanting and etching. The device of the invention has much better reliability than conventional devices, as its voltage distribution is much better and there is no localized high electric field. The device is easier to scale and, because an advanced stepper is not needed, results in reduced manufacturizing costs.

BRIEF DESCRIPTION OF THE DRAWINGS

Further aspects of the invention and their technical advantages will be discerned with reference to the following detailed description when taken in conjunction with the drawings in which.

DETAILED DESCRIPTION OF THE INVENTION

Figure 1:
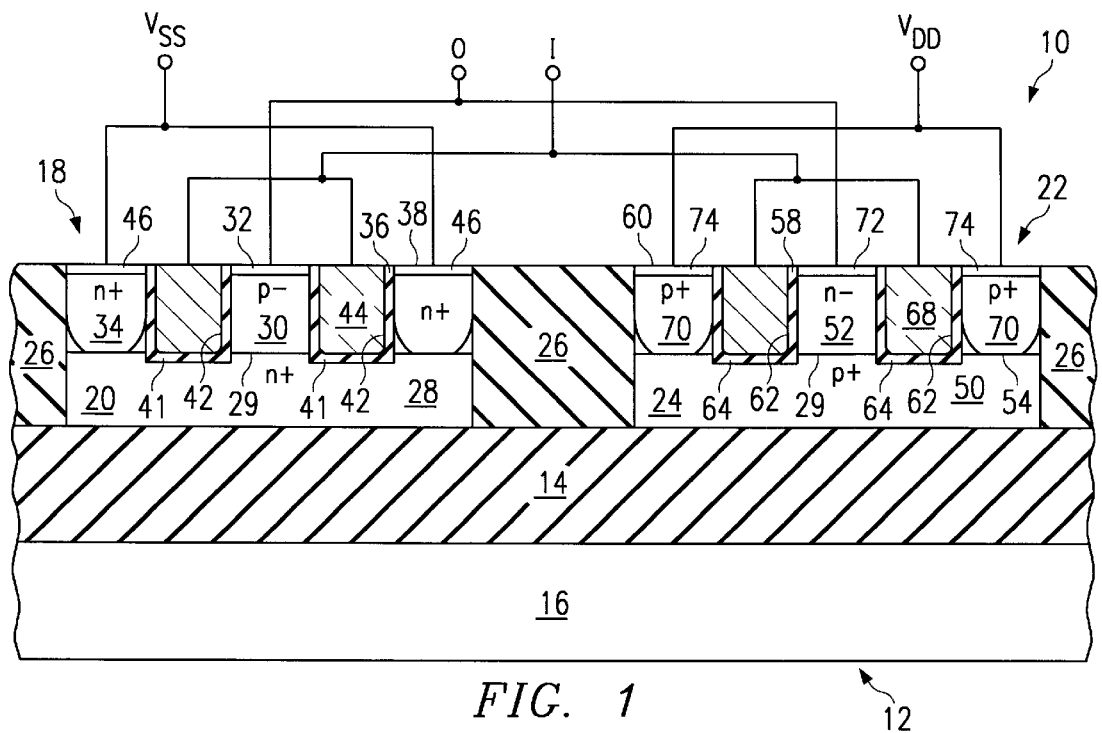
FIG. 1 is a highly magnified schematic cross-sectional view of a CMOS device according to the invention.
Figure 2:
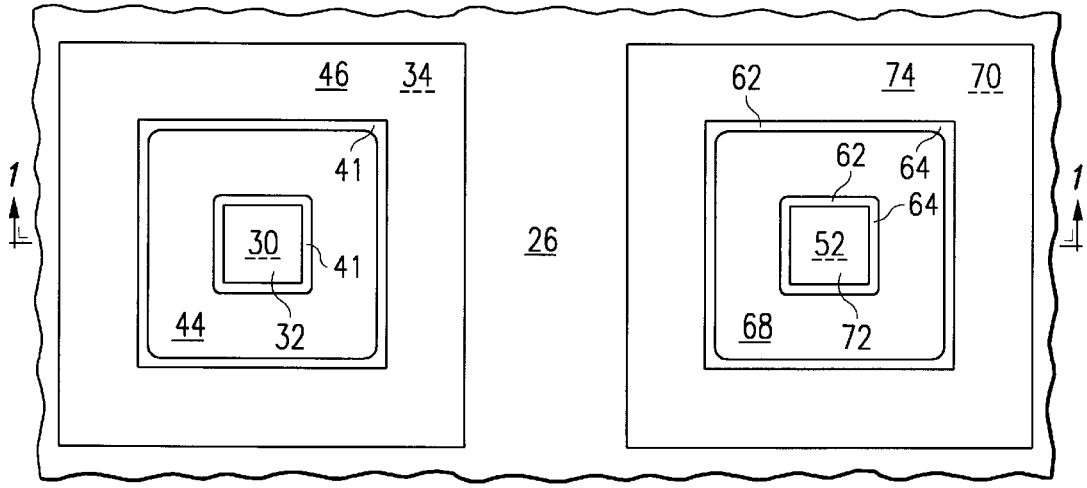
FIG. 2 is a top view of the device shown in FIG. 1, FIG. 1 being a sectional view taken substantially along line 1—1 of FIG. 2.

With reference to FIGS. 1 and 2, a complementary metal-oxide-semiconductor (CMOS) version of the invention is indicated generally at 10. Device 10 is formed on a substrate 12, which preferably includes a layer of oxide 14 that has been formed on a silicon base 16. Alternatively, the substrate 12 can be an undoped bulk silicon or other semiconductor layer. The described embodiment uses silicon as the semiconductor, but other semiconductor materials such as gallium arsenide can be used.

Preferably, the device is composed of an n-channel field effect transistor indicated generally at 18 and formed in a first semiconductor layer or mesa 20, and a second, p-channel field effect transistor 22 formed in a second semiconductor layer or mesa 24. Mesas 20 and 24 are spaced apart by insulator regions 26. Thus, transistors 18 and 22 are completely isolated from each other and other semiconductor devices in all directions. Initially or later, layer 20 is lightly doped to be (p−), and layer 24 is lightly doped to be (n−).

N-channel transistor 18 includes a heavily doped (n+) source region 28 that preferably extends the entire width of the mesa 20. An upper boundary 29 of region 28 is spaced away from a top surface 38 of the layer 20. A vertical channel region 30 is disposed adjacent boundary 29 and spaces region 28 from an (n+) surface drain region 32. A source connector region 34 extends from the top surface 38 to at least boundary 29. A preferably endless or ring-shaped trench 36 is patterned and etched into layer 20 to extend from the top surface 38 of the layer 20 to at least the boundary 29 of source region 28. The sidewalls 42 of the trench 36 laterally define the extent of channel region 30 and provide an extensive area through which an electric field may be imposed. A gate insulator layer 41, which for example can be oxide, nitrided oxide or an oxide-nitride-oxide sandwich, is grown on the bottom and sidewalls 42 of the trench 36.

A conductive gate 44, which is preferably formed of highly doped polycrystalline silicon (poly), is formed within that volume of trench 36 which is left over from the formation of the gate insulator 41. A drain region 32 is formed as by implantation of (n) type dopant to be adjacent surface 38 and to be spaced from source region 28 by channel region 30. A surface source region 46, which is formed at the face 38 of layer 29 and externally laterally of trench 36, can be formed at the same time as drain 32. In the embodiment illustrated in FIGS. 1 and 2, this surface source region is endless or ring-shaped, as is source connector region 34.

The p-channel transistor 22 is essentially the reverse of the n-channel transistor 18. The p-channel transistor has a highly doped (p+) source region 50 with an upper boundary 54 that is spaced from a top surface 60 of the semiconductor layer 24. An (n−) vertical channel region 52 is defined at the center of the device. An endless or ring-shaped trench 58 is patterned and etched to extend from the top surface 60 of the layer 24 to at least a boundary 54 of the (p+) source region 50 (and perhaps slightly entering into region 50, as shown), and a gate insulator 62 is formed on the bottom and sidewalls 64 of the trench 58. A second conductive (preferably highly doped polysilicon) gate 68 is formed within the volume left over by the gate insulator 62 inside the trench 58. A (p+) source connector region 70 is formed so as to extend from the surface 60 of the semiconductor layer 24 to at least the boundary 54 of the source region 50, so as to provide an ohmic contact to this source region from the surface. A (p+) drain region 72 is formed at the surface 60 of the semiconductor 24, along with a (p+) source contact region 74. While the p-channel transistor 22 is schematically shown to be of the same size as the n-channel transistor 18, in actual practice the channel region 52 of transistor 22 will usually be dimensioned to be larger than n-channel transistor 18 to have the same current-carrying capacity.

The electrical contacts made to the various semiconductor regions forming transistors 18 and 22 are shown schematically in FIG. 1. As assembled into a CMOS gate, a voltage $V_{dd}$ is connected to the source contact region 74 of p-channel transistor 22, an input I is connected to the poly gates 44 and 68 of both transistors 18 and 22, and an output 0 is connected to drain region 72 of p-channel transistor 22, and to drain 32 of the n-channel transistor 18. A source voltage Vss is connected to source region 28 through (n+) source connector region 34 of a n-channel transistor 18.

Figure 3:
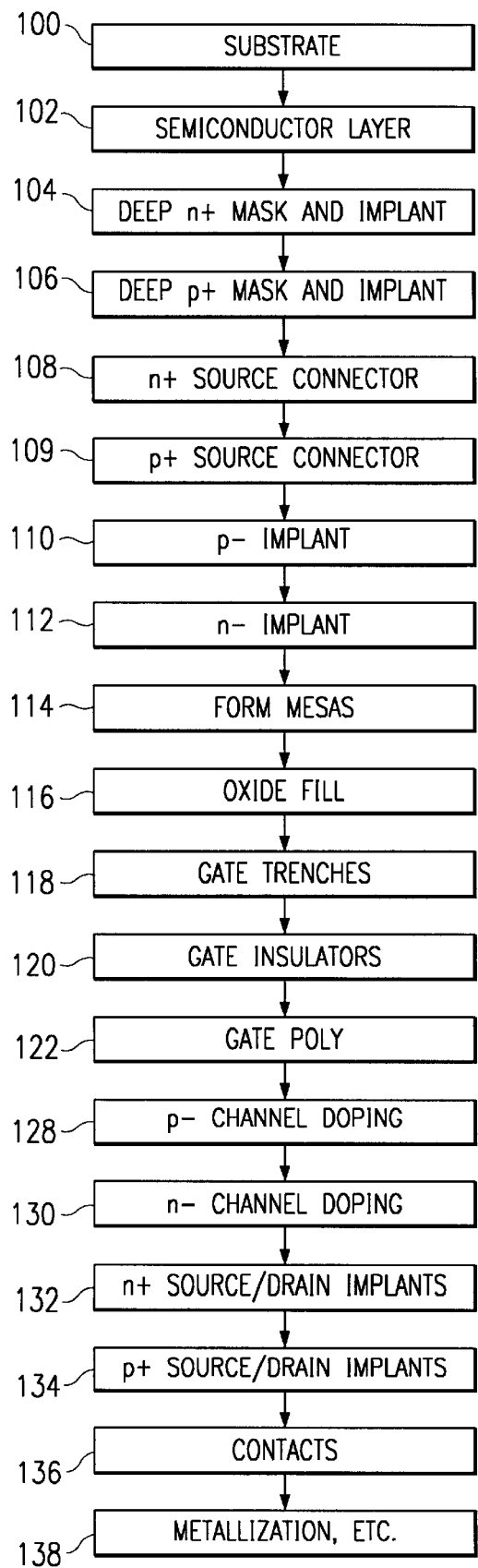
FIG. 3 is a representative process flow diagram for the construction of the device shown FIGS. 1 and 2.

A representative process for fabricating device 10 is illustrated in the flow diagram of FIG. 3. At a step 100, a substrate is provided. The substrate can be a conventional semiconductor substrate or, as illustrated in FIG. 1, can be a substrate including an oxide or quartz layer 14 on top of a semiconductor layer 16.

At step 102, a semiconductor layer is formed on the oxide layer 14. At step 104, an (n+) implant is performed through a mask to create (n+) source region 28. At step 106, the (n+) source region 28 is covered while a deep (p+) implant is performed on the semiconductor layer to create (p+) source region 50. After these two implants, a diffusion drive-in can be performed after step 106.

At step 108, a source connector mask is applied to the workpiece and an (n+) implant performed at a relatively high energy and high dose to create the (n+) source connector region 34 (FIG. 1). Similarly, at step 109, a further relatively high energy and high dose implant is performed to create (p+) source connector region 70. After step 109, a further diffusion drive-in step can be performed.

At step 110, the semiconductor layer is masked and a (p−) implant is performed in that region of the semiconductor layer that will form the (n−) channel transistor 18. This mask is then removed, and at step 112 a similar (n−) implant is performed on that portion of the semiconductor layer forming p-channel transistor 22.

At step 114, the semiconductor layer is patterned and etched to form mesas 20 and 24, such that islands of semiconductor are isolated from each other by an isolation channel. At step 116, an insulator such as oxide is deposited to form regions 26 that isolate the mesas 20 and 24 from each other and from other structures which may be fabricated on the substrate.

At step 118, endless or ring-shaped trenches 36 and 58 are patterned and anisotropically etched in a timed etch so as to extend completely through the semiconductor layer to at least upper boundaries 40 and 54 of the respective (n+) and (p+) source regions (see FIG. 1). The trenches can be slightly deeper than this, as shown. Once trenches 30 and 58 are formed at step 120, gate insulators 41 and 62 are grown on the bottoms of the trenches and on the sidewalls 42 and 64 thereof. The gate insulators may be straight oxide, nitrided oxide or may be formed of a trilayer of oxide, nitride and oxide for increased reliability. At step 122, poly is deposited across the face of the workpiece so as to fill the trenches 36 and 58. The excess poly may be removed by chemical/mechanical polishing (CMP) to produce a planar top surface of the structure and separated ring-shaped transistor gates.

At step 128, one or more masked implants are performed on the p-channel region 52, such as a threshold voltage adjust implant and a punch-through prevention implant. Similarly, $V_t$ adjust and punch-through prevention implants are performed on the n-channel region 30 at step 130. At step 132, a source/drain implant is performed with an (n) type dopant to create (n+) drain 32 as well as (n+) top source region 46. At step 134, a similar (p) source/drain implant is performed to create (p+) drain 72 and (p+) top source contact region 74. Both of these source/drain implant steps are performed through appropriate masks.

At step 136, contacts are made to surface source region 46, drain 32, gate 44, surface source region 74, drain 72 and gate 68. Finally, at step 138, appropriate metallization and passivation steps are carried out to complete the semiconductor device.

FIG. 3 illustrated only one possible fabrication method, and FIGS. 1 and 2 illustrate only one possible embodiment of the invention. In an alternative embodiment, a semiconductor layer may be formed on the oxide layer 14, and an epitaxial layer formed on the buried semiconductor layer.

The base or buried semiconductor layer may be highly doped in order to create the source regions as shown prior to the growth of the subsequent epitaxial layer.

Figure 4:
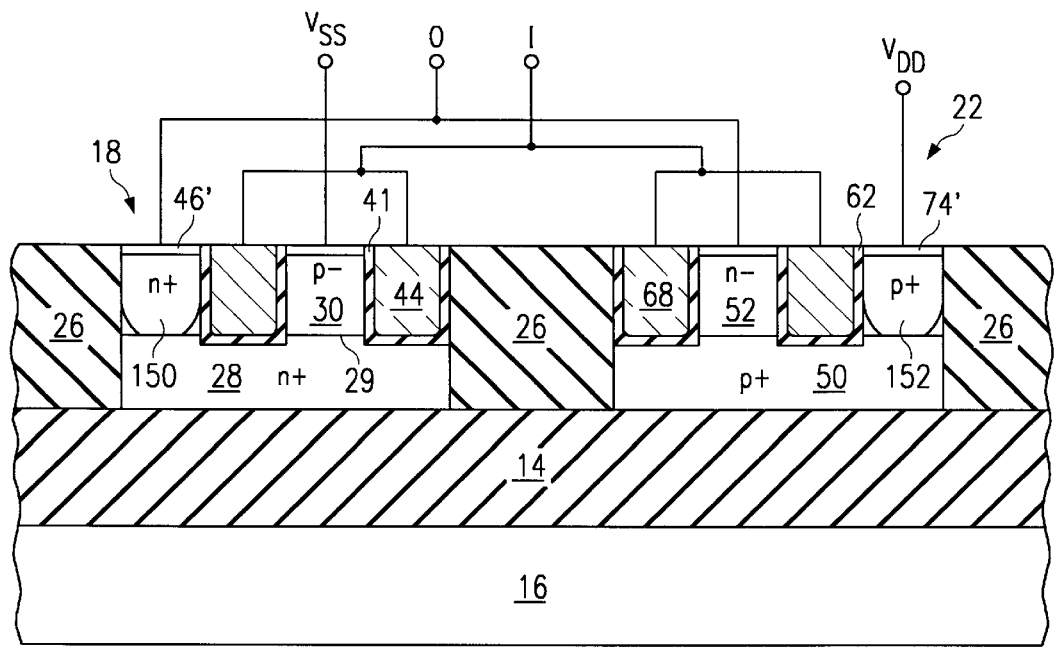
FIG. 4 is a high magnified schematic cross-sectional view of an alternative embodiment of the invention.
Figure 5:
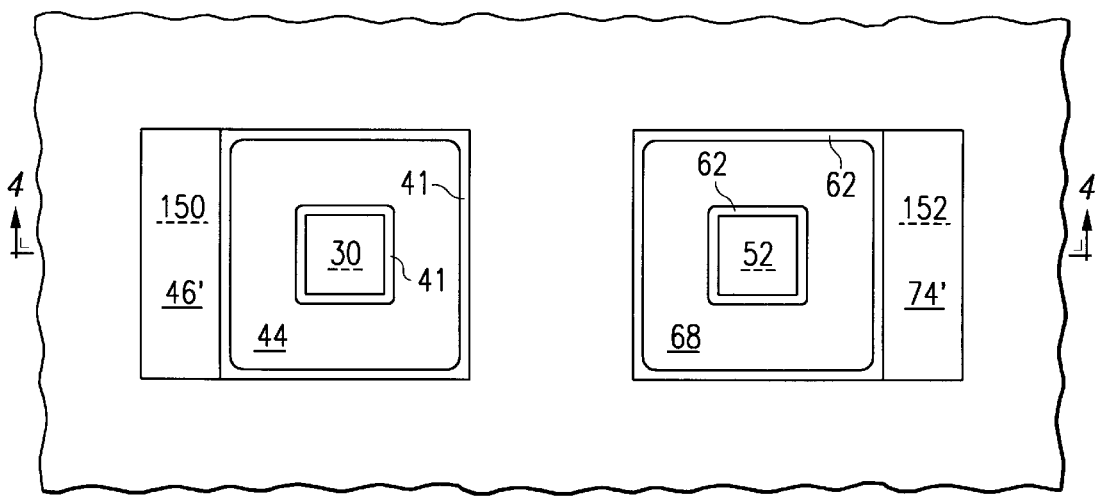
FIG. 5 is a top view of the device shown in FIG. 4, FIG. 4 being a sectional view taken substantially along line 4—4 of FIG. 5.

A further embodiment of the invention is illustrated in FIGS. 4 and 5, in which like characters identify like parts with respect to FIGS. 1 and 2. In the n-channel transistor 18, the (n+) source region 28 is not as laterally extensive as its counterpart in FIG. 1. An (n+) source connector region 150 is formed as a bar (FIG. 5) rather than as an annular region. The source connector region 150 is nonetheless sufficient to make ohmic connection to the source region 28. Similarly, a (p+) source connector region 152 is provided as a component of the (p+) channel transistor 22. In the top view, the source connector region 152 takes the shape of an elongated rectangle or bar, as is shown in FIG. 5. The (p+) source connector region 152 makes ohmic contact with the (p+) source region 50.

In a further embodiment (not shown), the source regions 28 and 50 may laterally extend only between the respective vertical channel regions 30 and 52 and the respective source connector regions 150 and 152. Further, the source connector regions 150 and 152 may be reduced in lateral extent to be only sufficient to receive a contact. In place of oxide isolation regions 26 being formed by filled trenches, a LOCOS process may be used.

In summary, a vertical-channel SOI CMOS device has been shown and described. The device exhibits bulk conduction, more uniform voltage distribution and a channel length which is not limited by lithography.

While a preferred embodiment of the invention has been described in the detailed description and illustrated in the accompanying drawings, the invention is not limited thereto but only by the scope and spirit of the appended claims.

What is claimed is:

1. A method for fabricating a vertical transistor, comprising the steps of:

providing a substrate having a surface;

forming a semiconductor layer on the substrate to be of a first conductivity type, a top surface of the semiconductor layer being opposite a bottom surface of the layer opposed to the substrate;

implanting the semiconductor layer to form a heavily doped region such that a boundary of the heavily doped region is spaced from the top surface of the semiconductor layer, the heavily doped region formed to be of a second conductivity type;

after the step of forming the heavily doped region, opening a trench in the semiconductor layer from the top surface of the semiconductor layer at least to the boundary of the heavily doped region;

responsive to said step of opening a trench, defining a channel region in the semiconductor layer, the channel region being of the first conductivity type opposite said second conductivity type;

forming a gate dielectric layer on sidewalls of said trench;

forming a conductive gate in the trench to be adjacent the gate dielectric layer;

implanting a source connector region in the semiconductor layer to be of the second conductivity type and to extend from the top surface of the semiconductor layer to the boundary of the heavily doped region, the source connector region disposed remotely from the channel region; and forming a drain region to be of the second conductivity type and to be at the surface of the semiconductor layer and spaced from the boundary of the heavily doped region and the source connector region, the drain region disposed insulatively adjacent the conductive gate and disposed to adjoin the channel region.

2. The method of claim 1, wherein said substrate includes a dielectric layer disposed adjacent said heavily doped region.

3. The method of claim 1, and further comprising the steps of:

after said step of forming the gate dielectric layer, depositing a layer of polycrystalline silicon in the trench and over the semiconductor layer; and removing the layer of polycrystalline silicon in regions outside of the trench to form the conductive gate.

4. The method of claim 1, and further comprising the steps of:

after said step of forming the semiconductor layer, forming an isolation channel in the semiconductor layer to form a mesa; and forming the conductive gate, the source connector region, the channel region and the drain region in the mesa.

5. The method of claim 4, wherein the channel region is square shaped from a top view.

6. The method of claim 1, and further comprising the step of opening the trench to laterally surround the channel region.

7. The method of claim 1, wherein the trench is an annular trench.

8. The method of claim 7, wherein the annular trench surrounds the channel region.

9. The method of claim 8, wherein the annular gate has a square shaped perimeter.

10. The method of claim 1, wherein the conductive gate is polysilicon.

11. A method for fabricating a vertical transistor, comprising the steps of:

providing a substrate;

forming a semiconductor layer on the substrate to be of a first conductivity type, a top surface of the semiconductor layer opposite a bottom surface of the semiconductor layer, the bottom surface being opposed to the substrate;

implanting the semiconductor layer to form a heavily doped region such that a boundary of the heavily doped region is spaced from the top surface of the semiconductor layer, the heavily doped region formed to be of a second conductivity type;

after the step of forming the heavily doped region, opening a trench in the semiconductor layer from the top surface of the semiconductor layer at least to the boundary of the heavily doped region, the trench completely surrounding a channel region, the channel region being of a first conductivity type opposite said second conductivity type;

forming a gate dielectric layer on sidewalls of said trench;

forming a conductive gate in the trench to be adjacent the gate dielectric layer;

implanting a source connector region in the semiconductor layer to be of the second conductivity type and to extend from the top surface of the semiconductor layer to the boundary of the heavily doped region, the source connector region disposed remotely from the channel region; and forming a drain region to be of the second conductivity type and to be at the top surface of the semiconductor layer and spaced from the boundary of the heavily doped region and the source connector region, the drain region disposed insulatively adjacent the conductive gate and disposed to adjoin the channel region.

12. The method of claim 11, wherein said substrate includes a dielectric layer disposed adjacent said heavily doped region.

13. The method of claim 11, and further comprising the steps of:
   after said step of forming the gate dielectric layer, depositing a layer of polycrystalline silicon in the trench and over the semiconductor layer; and
   removing the layer of polycrystalline silicon in regions outside of the trench to form the gate.

14. The method of claim 11, and further comprising the steps of:
   after said step of forming the semiconductor layer, forming an isolation channel in the semiconductor layer to form a mesa; and
   forming the conductive gate, the source connector region, the channel region and the drain region in the mesa.

15. The method of claim 11, and further comprising the step of opening the trench to laterally surround the channel region.

16. A method for fabricating a vertical transistor, comprising the steps of:
   forming a semiconductor layer on a substrate, the semiconductor layer having a top surface;
   implanting the semiconductor layer to form a first doped region such that a boundary of the first doped region is spaced from the top surface of the semiconductor layer, the first doped region formed to be of a second conductivity type;
   forming a trench in the semiconductor layer from the top surface of the semiconductor layer at least to a boundary of the first doped region, the trench defining a channel region, the channel region being of a first conductivity type opposite said second conductivity type;
   forming a conductive gate in the trench;
   implanting a source connector region in the semiconductor layer to be of the second conductivity type and to extend from the top surface of the semiconductor layer to the boundary of the first doped region, the source connector region disposed remotely from the channel region; and
   forming a drain region to be of the second conductivity type and to be at the top surface of the semiconductor layer and spaced from the boundary of the first doped region and the source connector region, the drain region disposed insulatively adjacent the conductive gate and disposed to adjoin the channel region.

17. The method of claim 16, wherein the semiconductor layer is adjacent a dielectric layer.

18. The method of claim 16, and further comprising the steps of:
   after said step of forming the trench depositing a layer of polycrystalline silicon in the trench and over the semiconductor layer; and
   removing the layer of polycrystalline silicon in regions outside of the trench to form the gate conductor.

19. The method of claim 16, and further comprising the steps of:
   after said step of forming the semiconductor layer, forming an isolation channel in the semiconductor layer to form a mesa; and
   forming the conductive gate, the source connector region, the channel region and the drain region in the mesa.

20. The method of claim 16, and further comprising the step of opening the trench to laterally surround the channel region.

* * * * *